United States Patent
Maung et al.

(10) Patent No.: US 7,881,144 B1
(45) Date of Patent: *Feb. 1, 2011

(54) PROCESS AND TEMPERATURE INVARIANT POWER ON RESET CIRCUIT USING A BANDGAP REFERENCE AND A LONG DELAY CHAIN

(75) Inventors: Leo Min Maung, Fremont, CA (US); William Bradley Vest, San Jose, CA (US); Thomas Henry White, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 254 days.

This patent is subject to a terminal disclaimer.

(21) Appl. No.: 12/132,212

(22) Filed: Jun. 3, 2008

Related U.S. Application Data

(63) Continuation of application No. 11/223,822, filed on Sep. 9, 2005, now Pat. No. 7,391,665.

(51) Int. Cl.
*G11C 5/14* (2006.01)
(52) U.S. Cl. .......... 365/226; 327/142; 327/143
(58) Field of Classification Search ........ 327/142, 327/143; 365/226
See application file for complete search history.

(56) References Cited

U.S. PATENT DOCUMENTS

| | | | | |
|---|---|---|---|---|
| 6,877,112 | B1 * | 4/2005 | Iino et al. | 714/23 |
| 7,031,188 | B2 * | 4/2006 | Lee et al. | 365/185.04 |
| 7,391,665 | B1 * | 6/2008 | Maung et al. | 365/226 |

* cited by examiner

*Primary Examiner*—Hoai V Ho
*Assistant Examiner*—Kretelia Graham
(74) *Attorney, Agent, or Firm*—Ropes & Gray LLP

(57) ABSTRACT

A power-on-reset circuit determines when it is safe for a programmable device to access configuration data from an associated non-volatile memory following a reset operation. The power-on-reset circuit receives a bandgap reference voltage produced by the programmable device. A comparator circuit is used to trigger a self-clocking delay unit when the bandgap reference voltage reaches a threshold level. The self-clocking delay unit generates its own clock signal independent of the clock frequency of the programmable device. The self-clocking delay unit may use edge-dependent delay units in a feedback loop to generate the clock signal. Using its own clock signal, the self-clocking delay unit waits for a predetermined time period and the outputs a signal to be used to enable access to the associated non-volatile memory.

17 Claims, 5 Drawing Sheets

PROCESS AND TEMPERATURE INVARIANT POWER ON RESET CIRCUIT USING A BANDGAP REFERENCE AND A LONG DELAY CHAIN

CROSS-REFERENCES TO RELATED APPLICATIONS

The present application is a continuation of U.S. application Ser. No. 11/223,822, filed Sep. 9, 2005, and entitled "Process and Temperature Invariant Power on Reset Circuit Using a Bandgap Reference and a Long Delay Chain", and is herein fully incorporated by reference for all purposes.

BACKGROUND OF THE INVENTION

The present invention relates to the field of programmable devices. Programmable devices, such as FPGAs, typically include thousands of programmable logic cells that use combinations of logic gates and/or look-up tables to perform logic operations. Programmable devices also include a number of functional blocks having specialized logic devices adapted to specific logic operations, such as adders, multiply and accumulate circuits, phase-locked loops, and one or more memory units for storage and retrieval of data used by the logic cells. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

The configuration of the logic cells, functional blocks, switching circuits, and other components of the programmable device is referred to as configuration data. Users specify a user design that performs a desired information processing function. Compilation software tools analyze the user design and generate corresponding configuration data that implements the desired information processing function using a programmable device. The user-created configuration data can be temporarily or permanently loaded into one or more programmable devices to implement the user design. If the user design is changed, updated configuration data can be loaded into the programmable device to implement the changed user design.

In some applications, a copy of the configuration data for a programmable device is stored in non-volatile memory, such as ROM, flash memory, EEPROM, or any other type of memory capable of storing data following the removal of power. Upon powering-up or after a device reset, the programmable device loads configuration data from the non-volatile memory to implement the desired user design. The non-volatile memory can be external to the programmable device or integrated with the programmable device. In the latter case, non-volatile memory can be included on the same chip as the programmable device or on a separate chip integrated into the same chip package as the programmable device.

Following the activation or reset of a programmable device, the internal voltages within the programmable device and integrated non-volatile memory must reach nominal operating levels. Read failures can result from attempts to read configuration data from the non-volatile memory prior to it reaching nominal operating levels, which in turn can corrupt the configuration of the programmable device.

Power-on-reset circuits inhibit the operation of the programmable device and integrated non-volatile memory until internal voltages reach nominal operating levels. Often, the programmable device and integrated non-volatile memory can require different amounts of time and/or different voltage levels to operate properly. Furthermore, the programmable device and integrated non-volatile memory can require different trip points, which is the voltage at which the power-on-reset circuit must inhibit operation. In some applications, the internal voltage levels of the non-volatile memory may be inaccessible to power-on-reset circuits located within the programmable device, thus power-on-reset circuits must rely on a predetermined time delay following a reset of the programmable device to estimate when it is safe to begin reading from the integrated non-volatile memory.

It is therefore desirable for a system to include a power-on-reset circuit suitable for use with non-volatile memory associated with a programmable device in a wide variety of configurations. It is further desirable for the power-on-reset circuit to have relatively small trip point variation across a wide range of process, supply voltage, and temperature variations, as well as at different clock speeds of the programmable device. It is also desirable for the power-on-reset circuit to support long time delays with minimal area cost on a programmable device.

BRIEF SUMMARY OF THE INVENTION

An embodiment of the invention includes a power-on-reset circuit to determine when it is safe for a programmable device to access configuration data from an associated non-volatile memory following a reset operation. In an embodiment, the power-on-reset circuit receives a bandgap reference voltage produced by the programmable device. A comparator circuit is used to trigger a self-clocking delay unit when the bandgap reference voltage reaches a threshold level. The self-clocking delay unit generates its own clock signal independent of the clock frequency of the programmable device. In an embodiment, the self-clocking delay unit uses edge-dependent delay units in a feedback loop to generate the clock signal. Using its own clock signal, the self-clocking delay unit waits for a predetermined time period and the outputs a signal to be used to enable access to the associated non-volatile memory.

In an embodiment, a programmable device comprises a programmable logic circuit adapted to implement logic functions specified by configuration data, a configuration memory adapted to store at least a portion of the configuration data, a memory interface adapted to access configuration data stored in a non-volatile memory associated with the programmable device; and a programmable switching circuit providing a set of configurable connections within the programmable logic circuit and with the memory block and the configuration memory. The memory interface comprises a power-on-reset circuit adapted to indicate to the programmable device when it is safe to access data in the associated memory following a reset operation. In embodiments, the associated non-volatile memory may be integrated on the same chip as the programmable device or in the same package as the programmable device.

In an embodiment, the power-on-reset device comprises a reference voltage input adapted to receive a regulated reference voltage, a delay unit adapted to produce an output signal that indicates to the programmable device that it is ready to access data in an associated memory following a predetermined delay from receiving a trigger signal, and a voltage measurement circuit connected with the reference voltage input and adapted to send a trigger signal to a delay unit in response to the reference voltage input receiving a voltage value above a predetermined voltage level. The delay unit is adapted to operate independently of a clock signal of the programmable device.

In an embodiment, the delay unit comprises a clock generation circuit adapted to generate a clock signal for the delay unit independently of the clock signal of the programmable device, a counter adapted to change its state in response to the clock signal of the delay unit, and a circuit adapted to generate the output signal in response to a final counter state. The clock generation circuit includes a trigger signal input and a feedback loop adapted to generate the clock signal of a predetermined frequency in response to receiving a trigger signal via the trigger signal input. The feedback loop may include at least one edge delay unit. The edge delay unit is adapted to output a first signal in response to a first type of input transition following a first predetermined delay period and to output a second signal in response to a second type of input transition following a second predetermined delay period that is smaller than the first predetermined delay period.

BRIEF DESCRIPTION OF THE DRAWINGS

The invention will be described with reference to the drawings, in which.

DETAILED DESCRIPTION OF THE INVENTION

Figure 1:
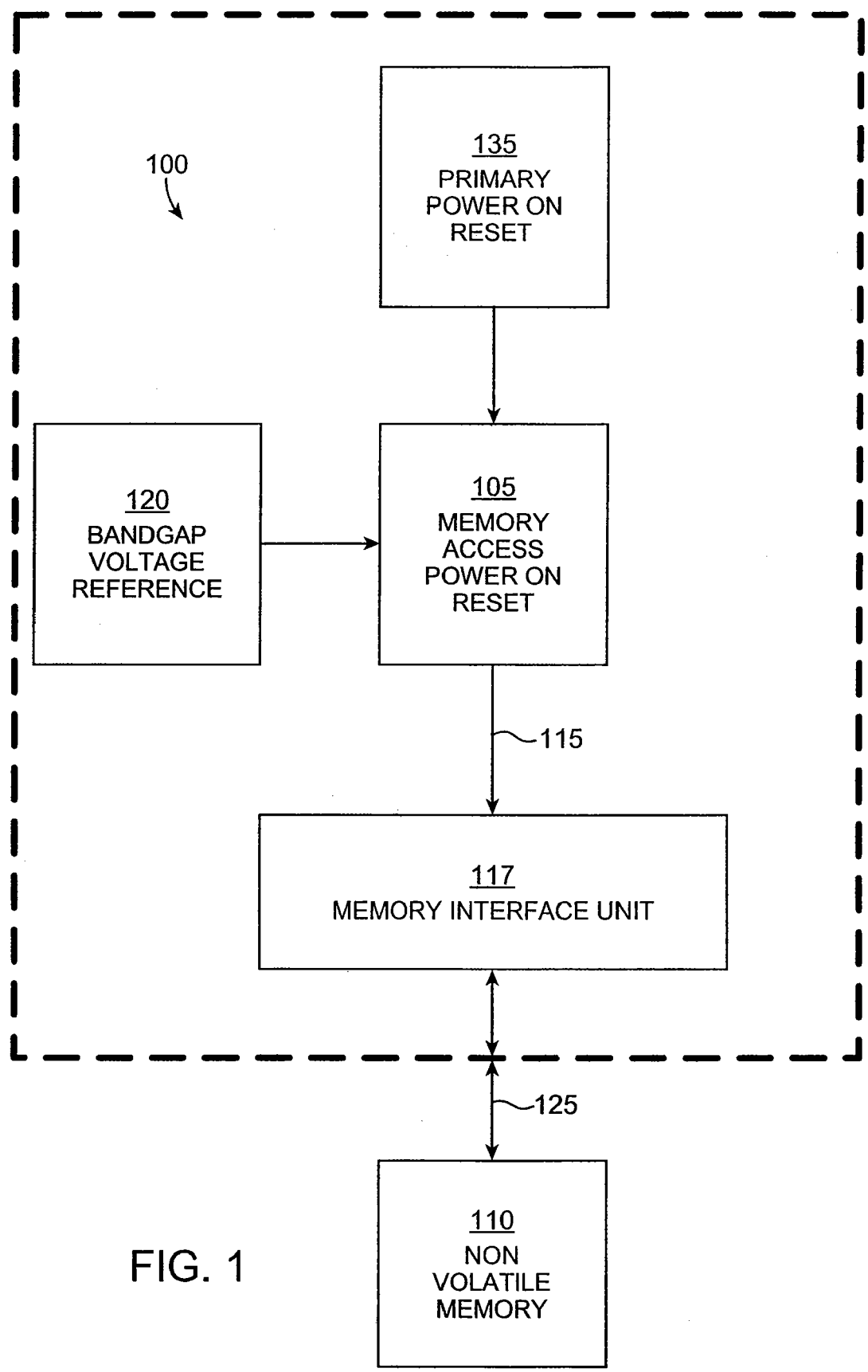
FIG. 1 illustrates a portion of a programmable device according to an embodiment of the invention.

FIG. 1 illustrates a portion of a programmable device 100 according to an embodiment of the invention. Programmable device 100 includes a memory access power-on-reset circuit 105. The memory access power-on-reset circuit 105 determines when the internal voltages for a non-volatile memory 110 have reached nominal operating levels and provides a memory access enable signal 115 indicating to the programmable device that it is safe to read configuration data from the non-volatile memory 110. In an embodiment, the non-volatile memory 110 can be integrated with the same chip or within the same chip package as programmable device 100. In an embodiment, the programmable device is inhibited from reading configuration data from the non-volatile memory 110 until the memory access enable signal 115 is emitted by the memory access power-on-reset circuit 105. A memory interface unit 117 is inhibited from accessing non-volatile memory 110 until it receives memory access enable signal 115. The programmable device 100 communicates with the non-volatile memory 110 via communications bus 125.

In an embodiment, the bandgap voltage reference unit 120 provides a reference voltage level used by internal portions of the programmable device. In an embodiment, the bandgap voltage reference unit 120 outputs a regulated reference voltage that closely follows the external voltage supplied to the programmable device until the external voltage exceeds a predetermined threshold value. At that point, the reference voltage provided by the bandgap voltage reference unit stays constant at a predetermined reference voltage value until the external supply voltage falls below the threshold value.

In an embodiment, the memory access power-on-reset circuit 105 estimates when the non-volatile memory 110 has reached nominal operating voltage levels by waiting a predetermined time period following a reset operation. In some applications, the tolerances of nominal operating voltages for non-volatile memory 110 across different process, temperature, and voltage variations is often much smaller than that of programmable devices 100. In an embodiment, the memory access power-on-reset circuit 105 relies in part on a reference voltage from a bandgap voltage reference unit 120 to achieve appropriate tolerances for the time delay. As discussed in detail below, the memory access power-on-reset circuit 105 measures the reference voltage supplied by the bandgap voltage reference unit 120 to determine a starting point for the time delay.

In a further embodiment, the programmable device 100 includes a primary power-on-reset circuit 135. The primary power-on-reset circuit 135 determines when the internal voltages of the programmable device 100 have reached nominal operating values. In an embodiment, the operation of the memory access power-on-reset circuit 105 is inhibited until the primary power-on-reset circuit 135 indicates that the internal voltages of the programmable device 100 have reached nominal operating levels.

Figure 2:
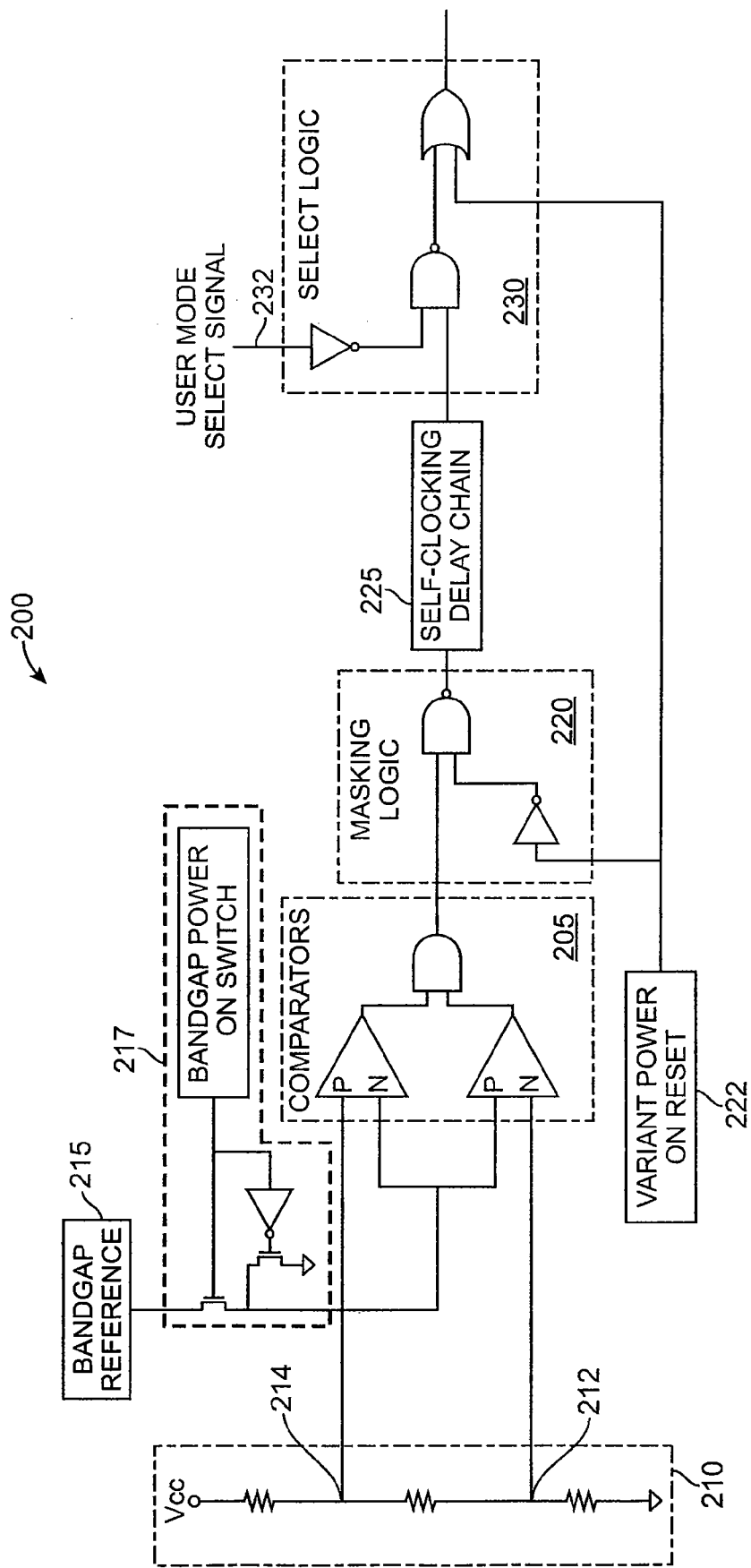
FIG. 2 illustrates a memory access power-on-reset circuit according to an embodiment of the invention.

FIG. 2 illustrates a memory access power-on-reset circuit 200 according to an embodiment of the invention. Memory access power-on-reset circuit includes a comparator circuit 205 connected with a voltage divider 210 and with the bandgap reference voltage 215. In an embodiment, the comparator circuit 205 is adapted to determine when the bandgap reference voltage 215 is between two voltages specified by voltage divider 210. The voltage divider 210 is connected with the Vcc or supply voltage of the programmable device and the ground voltage.

Using resistors or other types of electronic components, the voltage divider 210 provides two voltage outputs 212 and 214 proportional to the Vcc voltage supplied to the programmable device. In an embodiment, the voltage outputs 212 and 214 are 45% and 85%, respectively, of the Vcc voltage provided to the voltage divider 210. In alternate embodiments, different voltage levels can be provided by voltage divider outputs 212 and 214. In general, the voltage divider output 214 should be the trip point voltage of the power-on-reset circuit 200.

As discussed above, the bandgap reference voltage 215 closely follows the external voltage supplied to the programmable device until a threshold value is reached, at which time the bandgap reference voltage 215 stays constant. In an embodiment, a switching circuit 217 disconnects the bandgap reference voltage 215 from the comparator circuit 205 until the threshold value is reached. In alternate embodiments, switching circuit 217 can be omitted.

The comparator circuit 205 compares the bandgap reference voltage 215 with the voltages provided by voltage outputs 212 and 214. When the bandgap reference voltage 215 reaches a level between the voltage outputs 212 and 214, the comparator circuit 205 outputs a signal to the masking logic circuit 220. The masking logic circuit 220 is controlled by a signal 222 from the primary power-on-reset circuit. Signal 222 indicates that the internal voltages in the programmable device have reached nominal operating levels. The masking logic circuit 220 blocks the signal from the comparator circuit 205 until the signal 222 from the primary power-on-reset circuit indicates that the internal voltages in the programmable device have reached nominal operating levels.

When signal 222 indicates that the internal voltages in the programmable device have reached nominal operating levels, the signal from the output of comparator circuit 205 passes through the masking logic 220 and triggers the self-clocking delay unit 225. Upon being triggered, the self-clocking delay unit 225 waits a predetermined period of time and then outputs a memory access enable signal, which indicates that it is safe for the programmable device to read configuration data from non-volatile memory. An embodiment of the self-clocking delay unit 225 is discussed in detail below.

In an embodiment, the memory access enable signal from the self-clocking delay unit 225 can be blocked by user mode select logic 230. User mode select logic 230 is controlled by user mode select signal 232. When the user mode select signal 232 specifies that the programmable device is not in "user mode," the programmable device should load configuration data from non-volatile memory, such as a non-volatile memory integrated with the programmable device in the same chip or chip package, when the power-on-reset circuit 200 trips. When the user mode select signal 232 specifies that the programmable device is in "user mode," the output of the self-clocking delay unit 225 is blocked and the primary power-on-reset circuit of the programmable device controls the operation of the programmable device.

Figure 3:
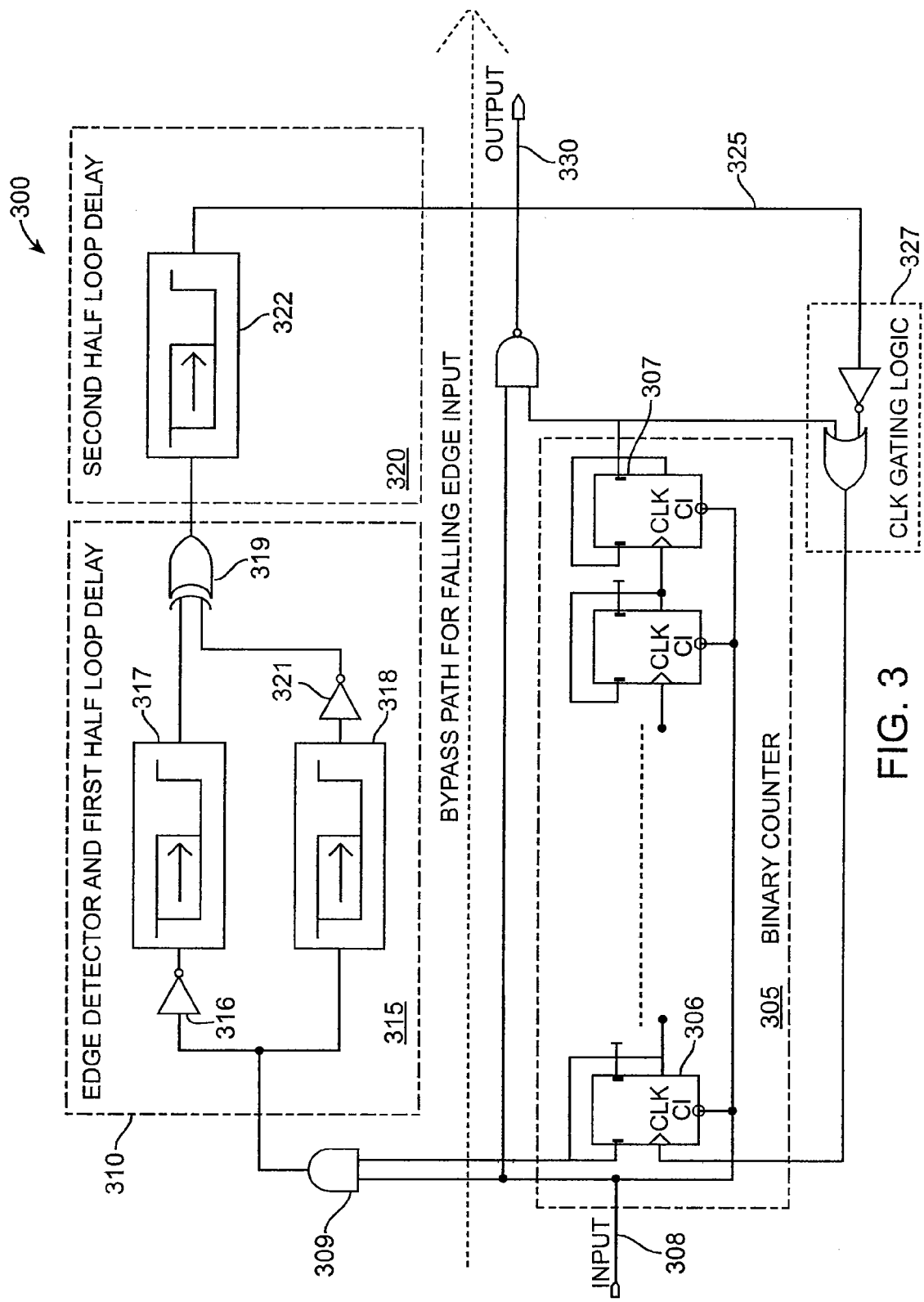
FIG. 3 illustrates a self-clocking delay unit according to an embodiment of the invention.

FIG. 3 illustrates a self-clocking delay unit 300 according to an embodiment of the invention. Delay unit 300 includes a counter 305 and a clock signal generator 310. The counter 305 includes a number of registers, including least-significant bit (LSB) register 306 and most-significant bit register 307. In an embodiment, the counter 305 include a total of six registers, thereby making counter 305 a six-bit counter. In alternate embodiments, the number of registers, along with the components of the clock signal generator 310, can be varied to change the delay period of the delay unit.

An embodiment of the delay unit 300 is triggered by a "1" signal received from input 308. In an embodiment, the input 308 is connected with the clear inputs of the registers of the counter 305, such that receiving a signal will reset all of these registers. This will set the inverted output of these registers, such as LSB register 306, to "1." The input 308 is also connected with an AND logic gate 309. The AND logic gate 309 is also connected with the inverted output of the LSB register 306. Upon input 308 changing from a "0" to a "1" signal, the AND logic gate 309 will send a "1" to the clock signal generator 310.

In an embodiment, the clock signal generator 310 includes two phases, an edge detection phase 315 and a delay phase 320. The edge detection phase 315 generates a pulse for every transition in the output of logic gate 309. In an embodiment, the edge detection phase 315 includes a pair of edge delay units 317 and 318. Upon receiving a falling edge signal, such as a high voltage (e.g. "1") transitioning to a low voltage (e.g. "0"), the edge delay unit outputs a copy of the signal following a predetermined time delay. Conversely, a rising edge signal passes through an edge delay unit without significant delay (e.g. as fast as practicable).

The edge delay units 317 and 318 are configured in conjunction with inverter logic gate 316 such that for each transition in the output of logic gate 309, one copy of the output will be delayed and another copy will not be delayed. The delayed and undelayed copies of this signal are both fed to exclusive OR logic gate 319, with the output of edge delay unit 318 first passing through inverter 321. The output of the exclusive OR gate 319 will be a pulse beginning at the time the undelayed copy of the signal is received by the logic gate 319 and ending at the time the delayed copy of the signal is received by the logic gate 319. Thus, edge detection phase 315 generates a pulse having a duration approximately equal to the predetermined time delay of the edge delay units 317 and 318.

The pulse generated by the edge detection phase 315 is fed to the delay phase 320. The delay phase 320 includes a similar edge delay unit 322. The edge delay unit 322 increases the duration of the pulse received by the delay phase 320. In an embodiment, the output 325 of the delay phase 320 is a pulse equal in duration to the sum of the delay values of either edge delay unit 317 or 318 and edge delay unit 322.

The output 325 is used as a clock input for the counter 305. In response to a pulse signal on output 325, the counter increments by one. As the output of the LSB register changes, which occurs on every clock pulse of output 325, the output of logic gate 309 also toggles. The toggling of the output of logic gate 309 triggers the creation of another clock pulse from the clock signal generator 310. Thus, the counter 305 increments itself at a frequency specified by the time delay parameters of the clock signal generator.

In an embodiment, counter 305 continues to increment in response to clock signal pulses on output 325 until the MSB register 307 is set to "1." At this point, the output of "1" from MSB register 307 passes through clock gating circuit 327 to the clock input of the counter 305. This has the effect of overriding any subsequent clock pulses from the clock signal generator 310 and stopping the counter. In addition, the output "1" from the MSB register 307 is output from the self-clocking delay unit 300. In an embodiment, this output from the delay unit 300 may be blocked or passed by the user mode select logic, as discussed above.

The self-clocking delay unit 300 has a number of advantages over other types of delay units. Programmable devices can be operated at a wide range of clock frequencies, often depending upon the constraints imposed by the logic design it is implementing. However, because it is self-clocking, delay unit 300 provides the same amount of delay regardless of the clock frequency of the programmable device. Additionally, delay unit 300 requires only a small number of registers to provide a relatively long delay time, thereby saving substantial chip area. Counters using the same clock signal as the other portion of the programmable device can often require substantially more registers to provide similar delay times. Additionally, delay unit 300 can be tailored to provide a wide range of delay values by changing the delay characteristics of the edge delay units and/or by changing the number of bits in the counter.

Figure 4:
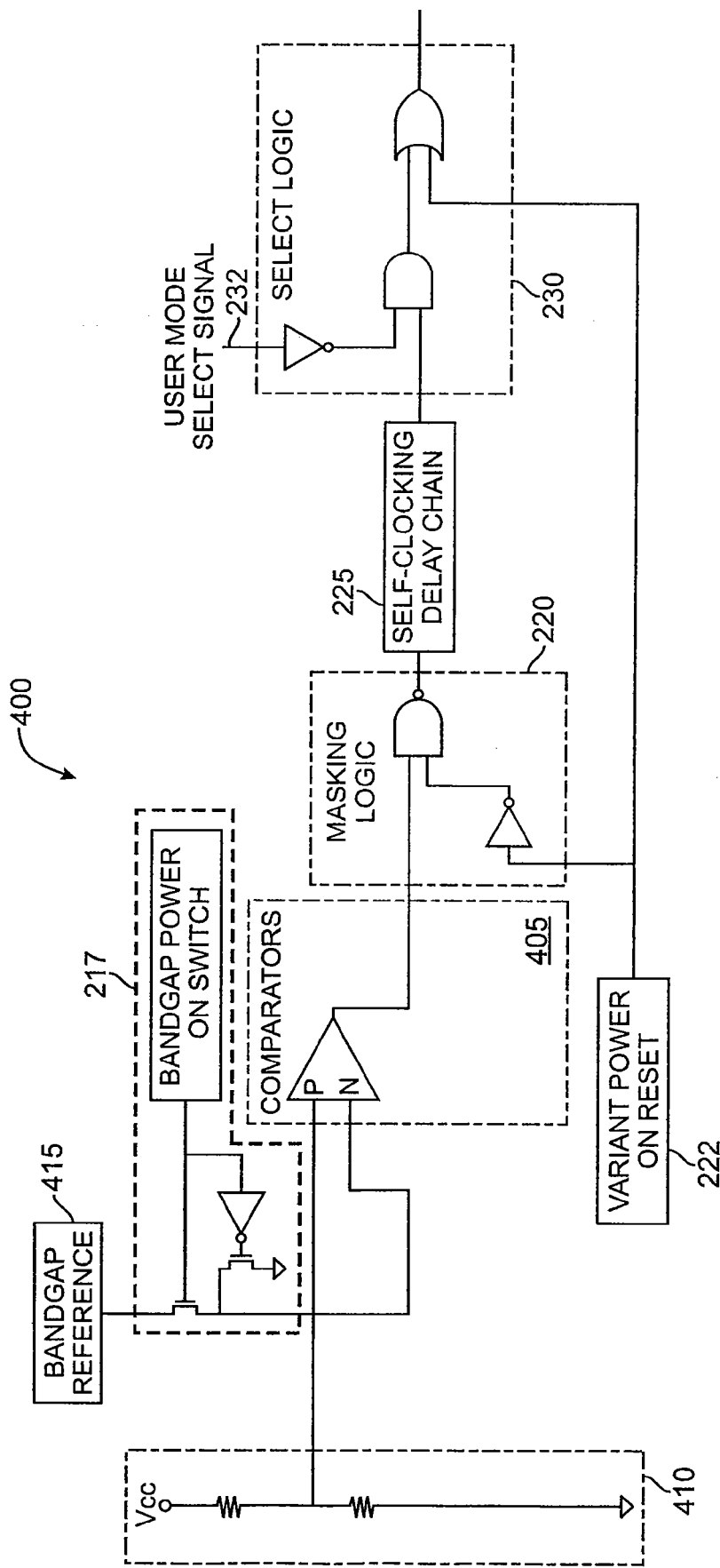
FIG. 4 illustrates a power-on-reset circuit according to an embodiment of the invention.

FIG. 4 illustrates a power-on-reset circuit 400 according to an embodiment of the invention. Power on reset circuit 400 operates in a similar manner as power-on-reset circuit 200. The self-clocking delay unit 225, user mode select logic 230, and user mode select signal 232 are all discussed above. However, power-on-reset circuit 400 includes a modified comparator 405 and a modified voltage divider 410. In this embodiment, the modified comparator 405 does not compare the bandgap reference voltage 415 with a lower bounding voltage. Instead, the power-on-reset circuit 400 relies on the supply voltage provided by a voltage regulator. The voltage regulator ensures that the supply voltage will not reach operating levels until after the bandgap reference voltage is above a minimum voltage level. The comparator 405 outputs a signal to the masking logic circuit 220 while the bandgap reference signal is below an upper bounding voltage provided by the modified voltage divider 410.

Figure 5:
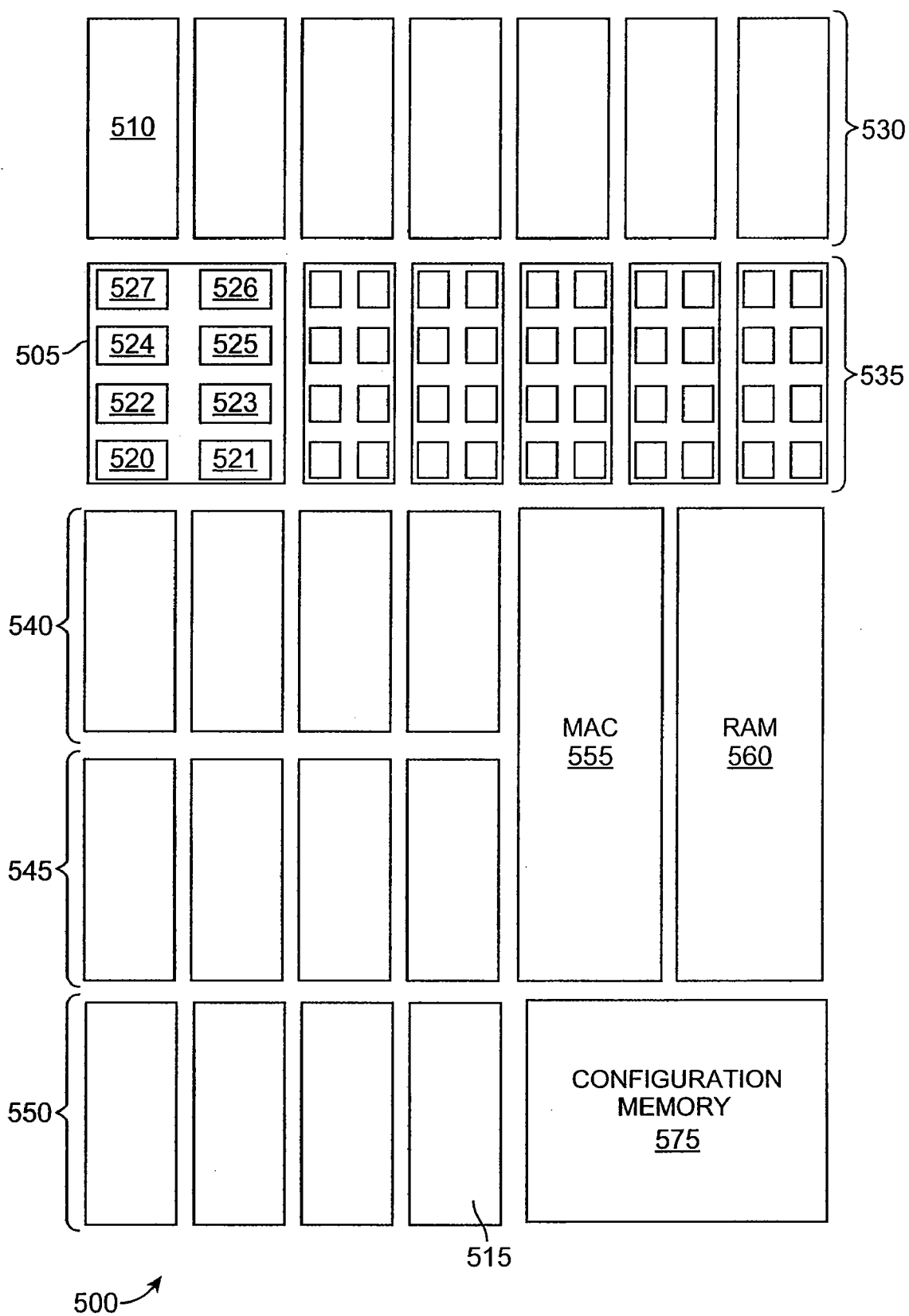
FIG. 5 illustrates a programmable device suitable for use with an embodiment of the invention.

FIG. 5 illustrates a programmable device according to an embodiment of the invention. Programmable device 500 includes a number of logic array blocks (LABs), such as LABs 505, 510, 515. Each LAB includes a number of programmable logic cells using logic gates and/or look-up tables to perform a logic operation. LAB 505 illustrates in detail logic cells 520, 521, 522, 523, 524, 525, 526, and 527. Logic cells are omitted from other LABs in FIG. 5 for clarity. The LABs of device 500 are arranged into rows 530, 535, 540, 545, and 550. In an embodiment, the arrangement of logic cells within a LAB and of LABs within rows provides a hierarchical system of configurable connections of a programmable switching circuit, in which connections between logic cells within a LAB, between cells in different LABs in the same row, and between cell in LABs in different rows require progressively more resources and operate less efficiently.

In addition to logic cells arranged in LABs, programmable device 500 may also include specialized functional blocks, such as multiply and accumulate block (MAC) 555 and random access memory block (RAM) 560. Variations of programmable device may omit some types of functional blocks or include other types of functional blocks, depending upon the intended applications. The configuration of the programmable device is specified at least in part by configuration data stored in configuration memory 575. The configuration data can include parameters specifying data rate communication schemes to be used with one or more memory blocks of the programmable device 500, such as memory block 560, as well as the configuration of the programmable switching circuit. Additional configuration data can be stored in other parts of the programmable device. For example, the configuration data can include look-up table data to be stored in look-up table hardware in a logic cell. The look-up table data specifies a function to be implemented by the look-up table hardware. For clarity, the portion of the programmable device 500 shown in FIG. 5 only includes a small number of logic cells, LABs, and functional blocks. Typical programmable devices will include thousands or tens of thousands of these elements.

Further embodiments can be envisioned to one of ordinary skill in the art after reading the attached documents. For example, although the invention has been discussed with reference to programmable devices, it is equally applicable to any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A power-on-reset circuit of a device having an associated memory, the power-on-reset circuit comprising:
    a mode select input; and
    a mode select circuit responsive to the mode select input and adapted to inhibit an output of the power-on-reset circuit in response to a signal received via the mode select input indicating that the device should access an alternate memory.

2. The power-on-reset circuit of claim 1, wherein the device comprises a programmable logic device.

3. The power-on-reset circuit of claim 1, wherein the associated memory includes a non-volatile memory that stores configuration data for the device.

4. The power-on-reset circuit of claim 3, the device further comprising:
    a programmable circuit adapted to implement logic functions specified by the configuration data; and
    a programmable switching circuit providing a set of configurable connections within the programmable circuit and with a memory block and the non-volatile memory.

5. The power-on-reset circuit of claim 4, wherein the alternate memory includes one or more memory units for storage and retrieval of data used by the logic cells.

6. The power-on-reset circuit of claim 1, wherein the power-on-reset circuit is adapted to signal the device when data in the associated memory is accessible following a reset operation.

7. The power-on-reset circuit of claim 1, further comprising:
    a reference voltage input adapted to receive a regulated reference voltage;
    a voltage measurement circuit adapted to signal a delay unit in response to the regulated reference voltage being within a predetermined range; and
    the delay unit adapted to produce a delayed output signal in response to the signal from the voltage measurement circuit.

8. The power-on-reset circuit of claim 1, wherein the associated memory is integrated on a same chip as the device.

9. The power-on-reset circuit of claim 1, wherein the associated memory is integrated in a same package as the device.

10. A power-on-reset circuit of a device having an associated memory, the power-on-reset circuit comprising:
    a masking circuit adapted to inhibit the power-on-reset circuit until the device is ready to operate following a reset operation; and
    a mode select circuit adapted to inhibit the power-on-reset circuit when the device should access an alternate memory.

11. The power-on-reset circuit of claim 10, further comprising
    a primary power-on-reset input adapted to transmit a signal to notify the masking circuit when the device is ready to operate following the reset operation.

12. The power-on-reset circuit of claim 11, further comprising
    a primary power-on-reset circuit adapted to generate the signal, wherein the primary power-on-reset input receives the signal from the primary power-on-reset circuit.

13. The power-on-reset circuit of claim 10, further comprising
    a mode select input adapted to transmit a signal when the device should access the alternate memory, wherein the mode select circuit inhibits an output of the power-on-reset circuit in response to the signal.

14. The power-on-reset circuit of claim 10, wherein the power-on-reset circuit is adapted to signal the device when data in the associated memory is accessible following a reset operation.

15. The power-on-reset circuit of claim 10, wherein the associated memory includes a non-volatile memory that stores configuration data for the device.

16. The power-on-reset circuit of claim 15, the device further comprising:
    a programmable circuit adapted to implement logic functions specified by the configuration data; and
    a programmable switching circuit providing a set of configurable connections within the programmable circuit and with a memory block and the non-volatile memory.

17. The power-on-reset circuit of claim 16, wherein the alternate memory includes one or more memory units for storage and retrieval of data used by the logic cells.

* * * * *